US012082692B1

(12) United States Patent
Chen

(10) Patent No.: US 12,082,692 B1
(45) Date of Patent: Sep. 10, 2024

(54) ADJUSTABLE VERTICAL STAND FOR ELECTRONICS

(71) Applicant: METEOR CITY LLC, Wilmington, DE (US)

(72) Inventor: Brian Johnny Chen, Quincy, MA (US)

(73) Assignee: METEOR CITY LLC, Wilmington, DE (US)

( * ) Notice: Subject to any disclaimer, the term of this patent is extended or adjusted under 35 U.S.C. 154(b) by 0 days.

(21) Appl. No.: 18/169,953

(22) Filed: Feb. 16, 2023

(51) Int. Cl.
*A47B 57/58* (2006.01)
*A47B 91/00* (2006.01)
*A47F 5/00* (2006.01)
*H05K 5/02* (2006.01)

(52) U.S. Cl.
CPC .......... *A47B 57/585* (2013.01); *A47B 57/588* (2013.01); *A47B 91/00* (2013.01); *A47F 5/005* (2013.01); *H05K 5/0234* (2013.01)

(58) Field of Classification Search
CPC .... H05K 5/0234; A47B 57/585; A47B 91/00; A47B 57/583; A47B 57/586; A47B 57/588; A47B 96/04; A47B 65/15; A47B 65/10; A47B 88/975; A47B 88/944; A47B 88/969; A47F 5/005; A47F 7/0042; B42F 17/12
USPC ........ 211/26, 26.2, 43, 10, 11, 184; 206/561
See application file for complete search history.

(56) References Cited

U.S. PATENT DOCUMENTS

| | | | | |
|---|---|---|---|---|
| 1,298,628 A | * | 3/1919 | Ross ........................ | B42F 17/08 211/11 |
| 1,664,650 A | * | 4/1928 | Van Korlaar ........... | B42F 17/08 211/11 |
| 1,736,574 A | * | 11/1929 | Binks ....................... | B42F 17/08 211/11 |
| 1,780,872 A | * | 11/1930 | Dumben ................. | A47B 65/20 211/11 |
| 2,056,683 A | * | 10/1936 | Mattman ............... | A47B 21/045 211/11 |
| 2,684,765 A | * | 7/1954 | Lowenstein, Jr. ...... | A47B 65/10 211/43 |
| 2,945,453 A | * | 7/1960 | Adams ................... | B61B 10/025 104/94 |
| 3,269,547 A | * | 8/1966 | Chamberlin ........... | A47B 57/58 211/11 |
| 3,512,652 A | * | 5/1970 | Armstrong ............. | G09F 3/20 312/140.3 |

(Continued)

FOREIGN PATENT DOCUMENTS

| | | |
|---|---|---|
| CN | 305275656 | 7/2019 |
| CN | 305385442 | 10/2019 |

(Continued)

*Primary Examiner* — Jennifer E. Novosad

(74) *Attorney, Agent, or Firm* — TUCKER ELLIS LLP

(57) ABSTRACT

A stand including a frame including a first and second side walls and a base having a top surface, a bottom surface, and at least one slot. The at least one slot may be perpendicular to the first and second side walls and may extend through the base of the frame. The stand may include at least one adjustment component disposed below the base of the frame and extending through the at least one slot in the base of the frame. The stand may have at least one divider having a base and a wall. The base of the divider may have a bottom surface with at least one hole configured to receive the at least one adjustment component. The at least one divider may be configured to be disposed between the first side wall and the second side wall.

20 Claims, 12 Drawing Sheets

(56) References Cited

U.S. PATENT DOCUMENTS

| | | | | |
|---|---|---|---|---|
| 3,513,983 | A | * | 5/1970 | Kellogg .................. F16B 12/24 |
| | | | | 211/184 |
| 3,870,156 | A | * | 3/1975 | O'Neill .............. A47B 87/0207 |
| | | | | 211/11 |
| 3,908,215 | A | * | 9/1975 | Watson ................ B42C 13/006 |
| | | | | 211/11 |
| 4,429,796 | A | * | 2/1984 | Sussman .............. B43M 99/008 |
| | | | | 211/11 |
| 4,503,982 | A | * | 3/1985 | Lewis ..................... A47F 5/005 |
| | | | | 211/49.1 |
| 4,512,480 | A | * | 4/1985 | Evenson ................ B42F 17/12 |
| | | | | 211/11 |
| 4,592,471 | A | * | 6/1986 | Bross .................... A47J 47/16 |
| | | | | 211/184 |
| D284,482 | S | * | 7/1986 | Sun ................................ D19/92 |
| 4,682,696 | A | * | 7/1987 | Sheu ...................... A47B 65/10 |
| | | | | 248/297.21 |
| D299,657 | S | * | 1/1989 | Hwang .......................... D19/75 |
| 4,802,593 | A | * | 2/1989 | Romanos ............... B43M 99/00 |
| | | | | 211/10 |
| D304,462 | S | * | 11/1989 | Evans ............................ D19/86 |
| D311,001 | S | | 10/1990 | Hassel et al. |
| 4,974,733 | A | * | 12/1990 | Evans .................... A47B 63/00 |
| | | | | 211/11 |
| 5,228,578 | A | * | 7/1993 | Wu ........................ A47B 65/20 |
| | | | | 211/175 |
| 5,474,190 | A | * | 12/1995 | Won-Kim ............ A47B 57/588 |
| | | | | 211/41.12 |
| 5,520,316 | A | * | 5/1996 | Chen ........................ B60R 7/02 |
| | | | | 224/567 |
| 5,664,691 | A | * | 9/1997 | Boivin-Paradis .... A47B 57/583 |
| | | | | 211/175 |
| 5,740,926 | A | * | 4/1998 | Mulloy .................. A47B 65/00 |
| | | | | 108/28 |
| 6,364,132 | B1 | * | 4/2002 | Feng .................... A47B 57/585 |
| | | | | 211/184 |
| 6,648,150 | B2 | * | 11/2003 | Hartstone .......... G11B 33/0461 |
| | | | | 211/11 |
| 7,086,538 | B2 | * | 8/2006 | Stravitz .................. B42F 17/20 |
| | | | | 211/11 |
| 7,143,901 | B1 | * | 12/2006 | Groves .............. B65D 19/0002 |
| | | | | 125/35 |
| 7,591,382 | B2 | * | 9/2009 | Brock .................... A45D 40/24 |
| | | | | 211/10 |
| 7,850,022 | B2 | * | 12/2010 | Fulmer ................ H05K 7/1425 |
| | | | | 211/186 |
| 8,317,040 | B2 | * | 11/2012 | Lanning ................. A47B 96/04 |
| | | | | 211/DIG. 1 |
| 8,708,145 | B2 | * | 4/2014 | Kuo .................. H01L 21/67369 |
| | | | | 211/41.18 |
| 8,875,909 | B2 | * | 11/2014 | Gerkensmeier ........ B65D 25/06 |
| | | | | 211/175 |
| D828,361 | S | | 9/2018 | Turksu et al. |
| 10,099,363 | B1 | * | 10/2018 | Hsieh ..................... A47G 29/08 |
| D844,623 | S | | 4/2019 | Chen |
| D917,495 | S | | 4/2021 | Hatfield et al. |
| 11,072,198 | B1 | * | 7/2021 | Savryha .................. B42F 11/00 |
| D936,067 | S | | 11/2021 | Kanter et al. |
| D939,515 | S | | 12/2021 | Zhang et al. |
| 11,199,290 | B2 | | 12/2021 | Hatfield et al. |
| 11,304,514 | B2 | * | 4/2022 | Lanphear ............. A47B 57/588 |
| D960,168 | S | | 8/2022 | Yang |
| 2005/0173355 | A1 | * | 8/2005 | Stravitz ................... B42F 17/20 |
| | | | | 211/11 |
| 2013/0075349 | A1 | * | 3/2013 | MacDonald ............ B42F 7/145 |
| | | | | 211/11 |
| 2015/0076086 | A1 | * | 3/2015 | Tsai ...................... A47B 57/586 |
| | | | | 211/11 |
| 2018/0110332 | A1 | * | 4/2018 | Nye ..................... A47B 57/583 |
| 2022/0171430 | A1 | | 6/2022 | Liu et al. |

FOREIGN PATENT DOCUMENTS

| | | |
|---|---|---|
| CN | 305688671 | 4/2020 |
| CN | 306351201 | 2/2021 |
| CN | 306363651 | 3/2021 |
| CN | 306753143 | 8/2021 |
| CN | 307083159 | 1/2022 |
| CN | B07054670 | 1/2022 |
| CN | 307108122 | 2/2022 |
| CN | 307327101 | 5/2022 |
| CN | 307532403 | 9/2022 |
| CN | 307532404 | 9/2022 |
| JP | 3126963 | 11/2006 |

* cited by examiner

1

ADJUSTABLE VERTICAL STAND FOR ELECTRONICS

TECHNICAL FIELD

The present invention relates generally to electronic device stands, and more particularly to adjustable, vertical electronic device stands.

BACKGROUND OF THE INVENTION

Electronic device stands are used to hold or support one or more electronic devices, most commonly on desks. Vertical stands can be used to hold one or more electronic devices in a vertical orientation to maximize desk space.

SUMMARY OF THE INVENTION

In accordance with an embodiment of the present invention, a stand for holding electronic devices is disclosed. The stand may comprise a frame including a frame base and first and second side walls extending from the frame base. The frame base may have a top surface, a bottom surface, and at least one slot. The at least one slot may be perpendicular to the first and second side wall and extend through the frame base. The stand may also include at least one adjustment component configured to extend through the at least one slot in the frame base. The stand may have at least one divider configured to be disposed between the first side wall and the second side wall. The at least one divider may have a divider top and divider base having a bottom surface with at least one hole configured to receive the at least one adjustment component. When the at least one divider is disposed between the first side wall and the second side wall, the divider wall of the at least one divider may be parallel to the first and second side walls, the bottom surface of the divider base of the at least one divider may contact the top surface of the frame base, the at least one hole of the at least one divider is aligned with the at least one slot. The at least one divider may be selectively positionable between the first and second side walls.

In another embodiment, the stand may comprise a frame including a frame base and first and second side walls extending from the frame base. The frame base may have a top surface, a bottom surface, and at least one recessed surface projecting down from the top surface. The at least one recessed surface defines at least one cavity. The stand may further comprise at least one divider configured to be disposed between the first and second side walls. The at least one divider may include a divider wall having a divider top and a divider base having at least one flanged pedestal with a bottom surface. When the at least one divider is disposed between the first and second side walls, the divider wall may be parallel to the first and second side walls and the bottom surface of the at least one flanged pedestal may contact the recessed surface of the frame base. The at least one divider may be selectively positionable between the first and second side walls.

In another embodiment, the stand may comprise a frame including a frame base and first and second side walls extending from the frame base. The frame base may have a top surface, a bottom surface, and at least one slot perpendicular to the first and second side walls extending through the frame base. The stand may have at least one foot projecting downward from the bottom surface of the frame base below the first side wall and at least one foot projecting downward from the bottom surface of the frame base below

2 the second side wall. The stand may further comprise at least one adjustment component having a grip end configured to be disposed below the bottom surface of the frame base and an attachment end opposite the grip end configured to extend through the at least one slot of the frame base. The stand may also have at least one divider configured to be disposed between the first side wall and the second side wall. The at least one divider may include a divider wall having a divider top and divider base. The divider base may have a bottom surface with at least one hole configured to receive the at least one adjustment component.

When the at least one divider is disposed between the first and second side walls, the wall of the at least one divider may be parallel to the first and second side walls, the bottom surface of the divider base of the at least one divider may contact the top surface of the frame base, and the at least one hole of the at least one divider may be aligned with the at least one slot. The at least one divider may be selectively positionable between the first and second side walls. The adjustment component may have a first position that prevents movement of the at least one and a second position where the at least one divider is movable to one of a plurality of positions between the first and second side walls.

These and other objects of this invention will be evident when viewed in light of the drawings, detailed description and appended claims.

BRIEF DESCRIPTION OF THE DRAWINGS

The invention may take physical form in certain parts and arrangements of parts, a preferred embodiment of which will be described in detail in the specification and illustrated in the accompanying drawings which form a part hereof, and wherein.

DETAILED DESCRIPTION OF THE INVENTION

Figure 1:
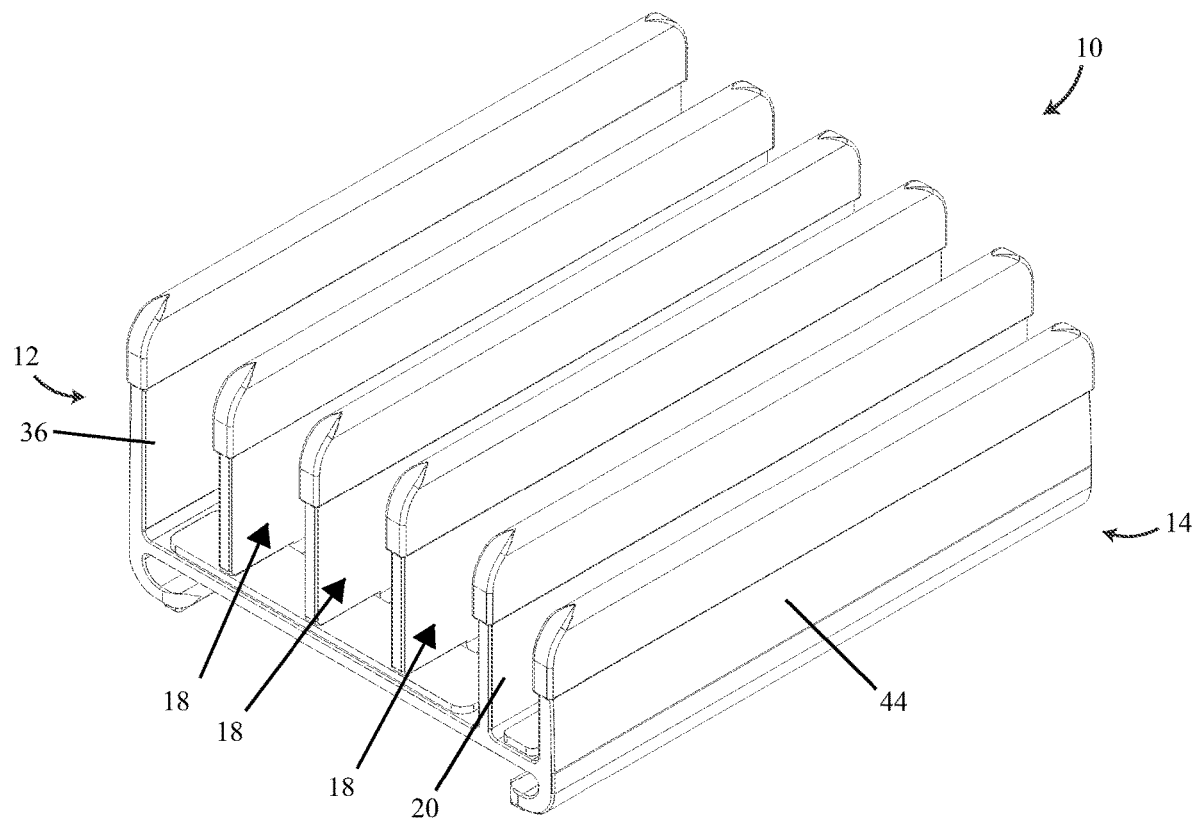
FIG. 1 is a top perspective view of an exemplary vertical stand.
Figure 2:
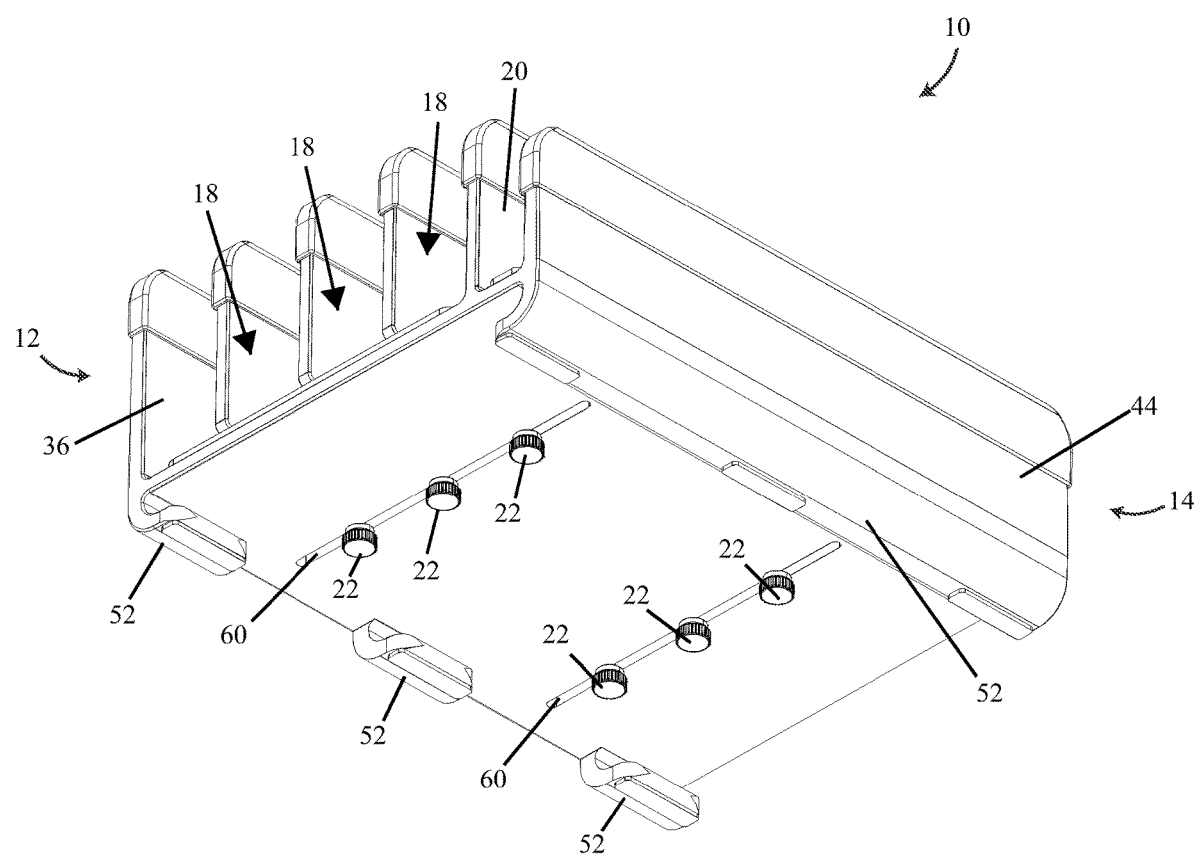
FIG. 2 is a bottom perspective view of an exemplary vertical stand.
Figure 3:
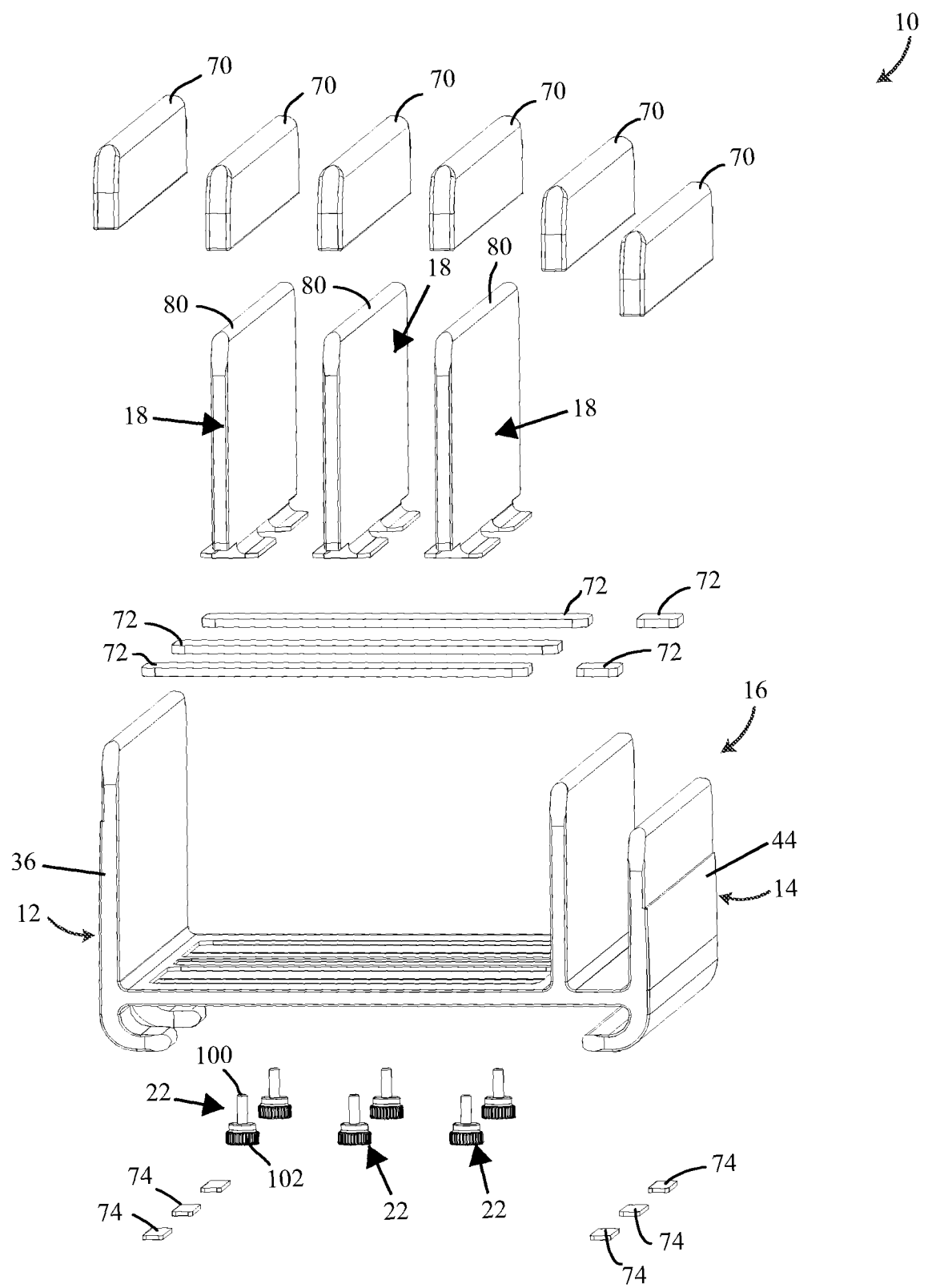
FIG. 3 is an exploded view of the exemplary vertical stand and its components.
Figure 4:
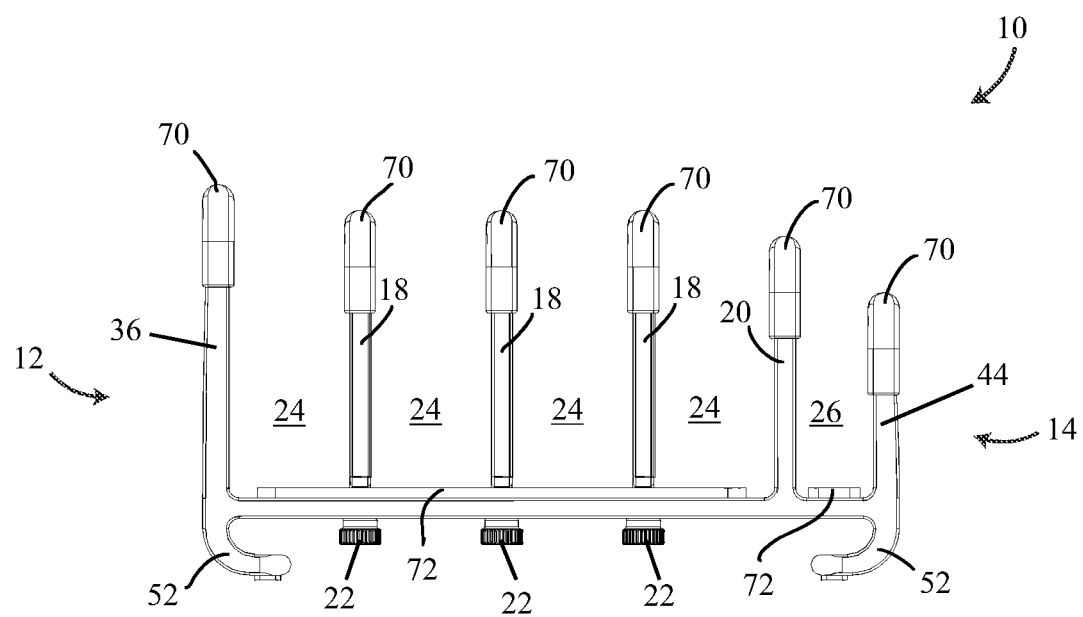
FIG. 4 is a front view of the exemplary vertical stand.
Figure 5:
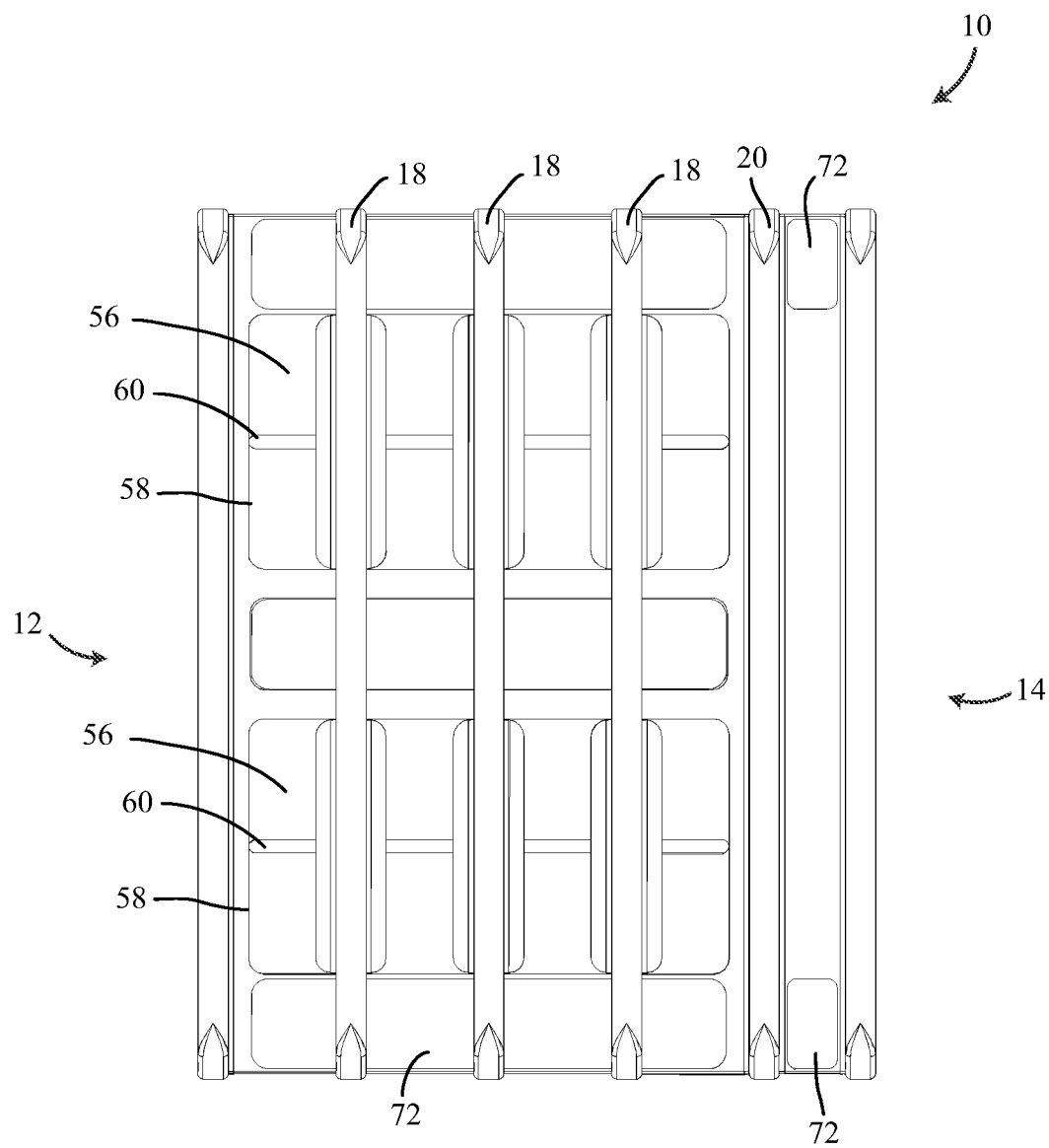
FIG. 5 is a top view of the exemplary vertical stand.
Figure 6:
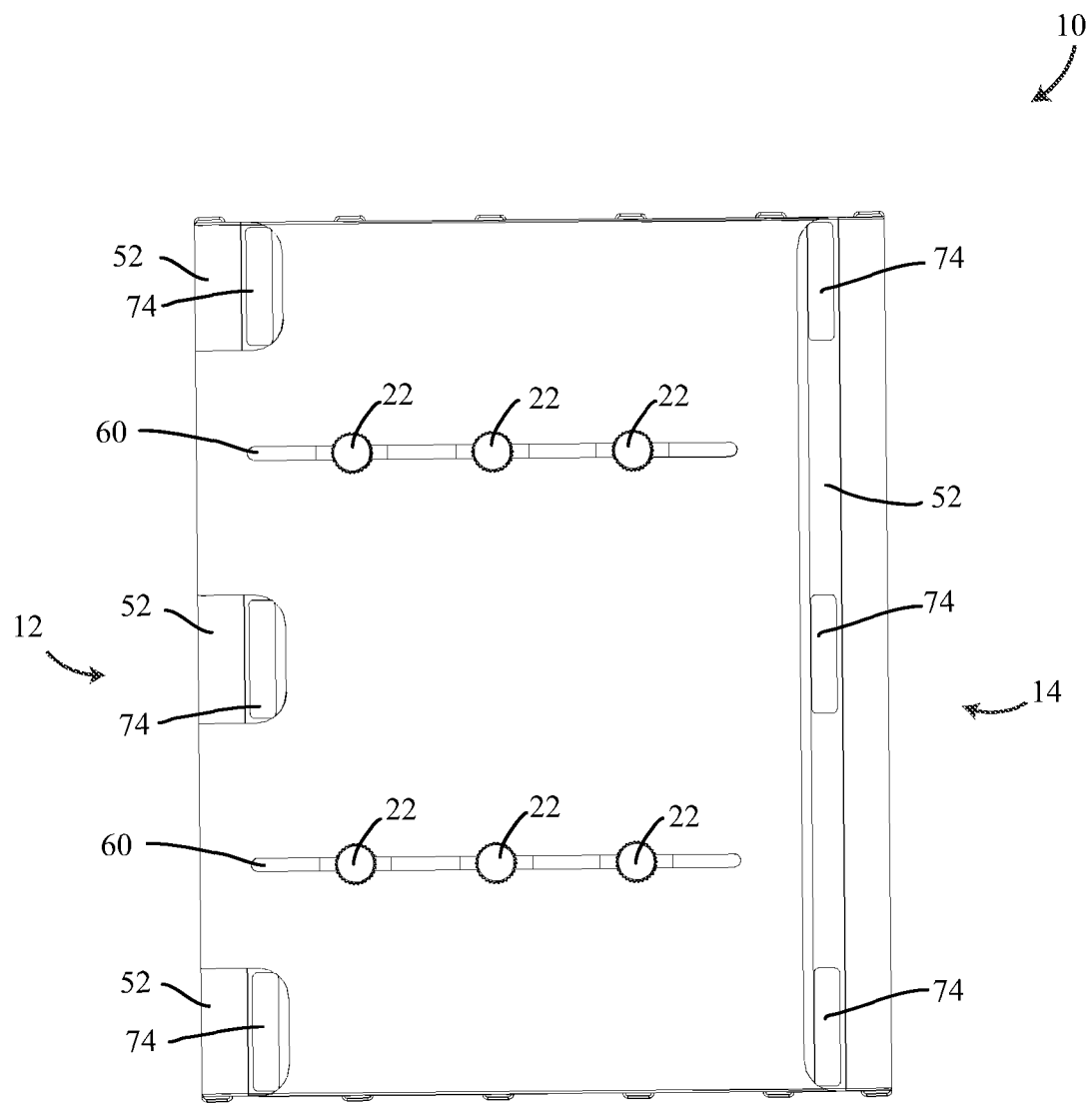
FIG. 6 is a bottom view of the exemplary vertical stand.

Embodiments of the invention relate to a stand for holding electronic devices. Various electronic devices, including but not limited to cellphones, tablets, and laptops, are commonly used to accomplish a variety of tasks in day-to-day activities at home or the workplace. Frequently, the electronic devices may be attached to a docking station at a desk or workstation where the user may not directly hold or interface with the electronic device.

A stand for holding electronic devices, like the disclosed embodiments, may maximize the available desktop space and storage by holding one or more electronic devices in a vertical orientation. The disclosed embodiments may be adjustable to accommodate various electronic devices with different dimensions, specifically the height of the device. The stand may provide toolless adjustability, meaning the dividers defining electronic device receiving areas may be selectively positioned by hand without requiring the use of a separate tool. The stand may also include bumpers and support pads made of non-marring materials to protect the electronic devices when placed in the stand.

With reference to the drawings, like reference numerals designate identical or corresponding parts throughout the several views. However, the inclusion of like elements in different views does not mean a given embodiment necessarily includes such elements or that all embodiments of the invention include such elements. The examples and figures are illustrative only and not meant to limit the invention, which is measured by the scope and spirit of the claims.

Turning now to FIGS. 1-6, an embodiment of a stand 10 is illustrated. The stand has a first side 12 and a second side 14 opposite the first side 12. The stand includes a frame 16, at least one movable divider 18 movably coupled to the frame 16, at least one fixed divider 20, and at least one adjustment component 22 coupled to the at least one movable divider 18. The fixed divider 20 may be integrally formed with the frame 16, for example by molding, or coupled to the frame 16 in a suitable manner. The frame 16, the at least one movable divider 18, and the fixed divider 20 define receiving spaces 24 configured to receive and support electronic devices. The fixed divider 20 may be adjacent the second side 14 and define a fixed receiving space 26. In an embodiment, the stand 10 may include a plurality of movable dividers 18, such as three movable dividers, one fixed divider 20 adjacent the second side 14 of the stand, and a plurality of adjustment components 22, for example two adjustment components per movable divider 18. It will be appreciated that the stand 10 may comprise as few as one divider 18 or more than three dividers 18. It will also be appreciated that the stand may have more than one fixed divider 20 or no fixed divider 20.

Figure 7:
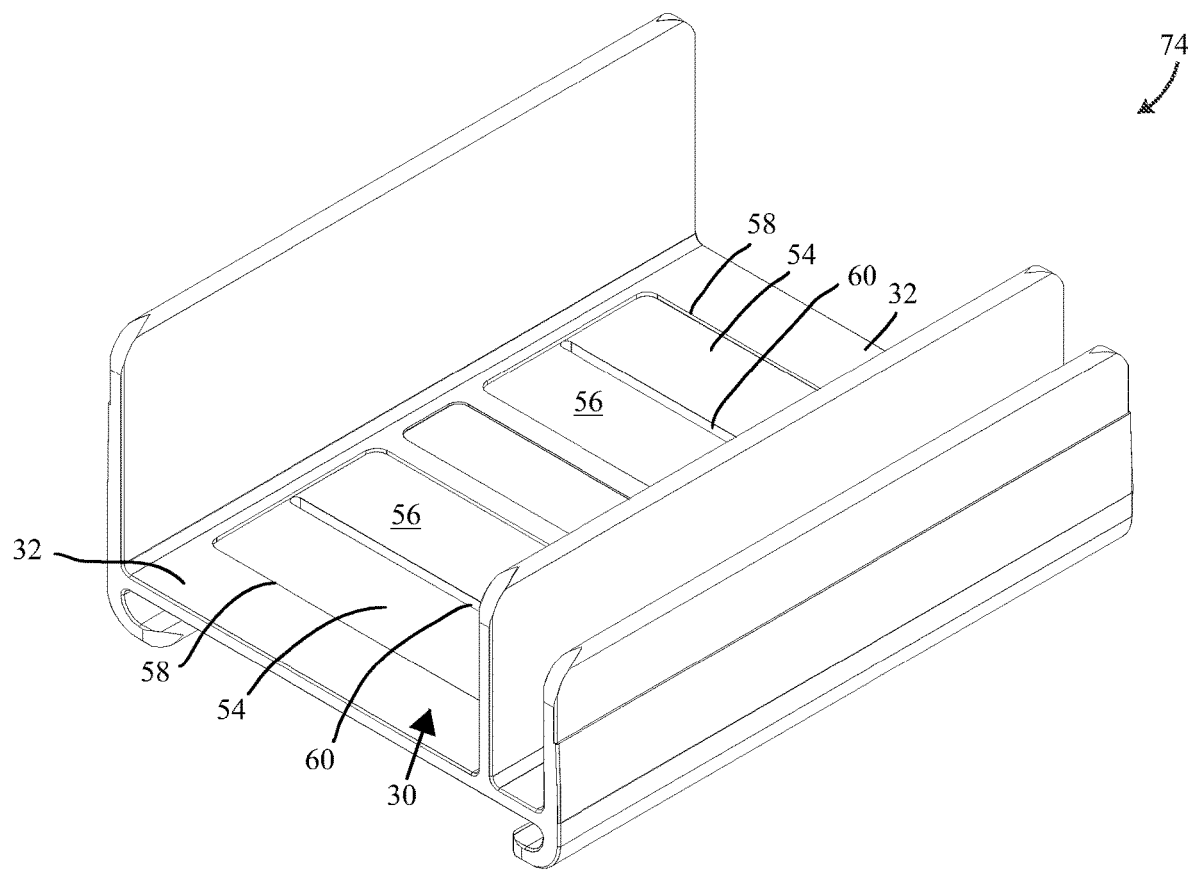
FIG. 7 is a perspective view of an exemplary vertical stand frame.
Figure 8:
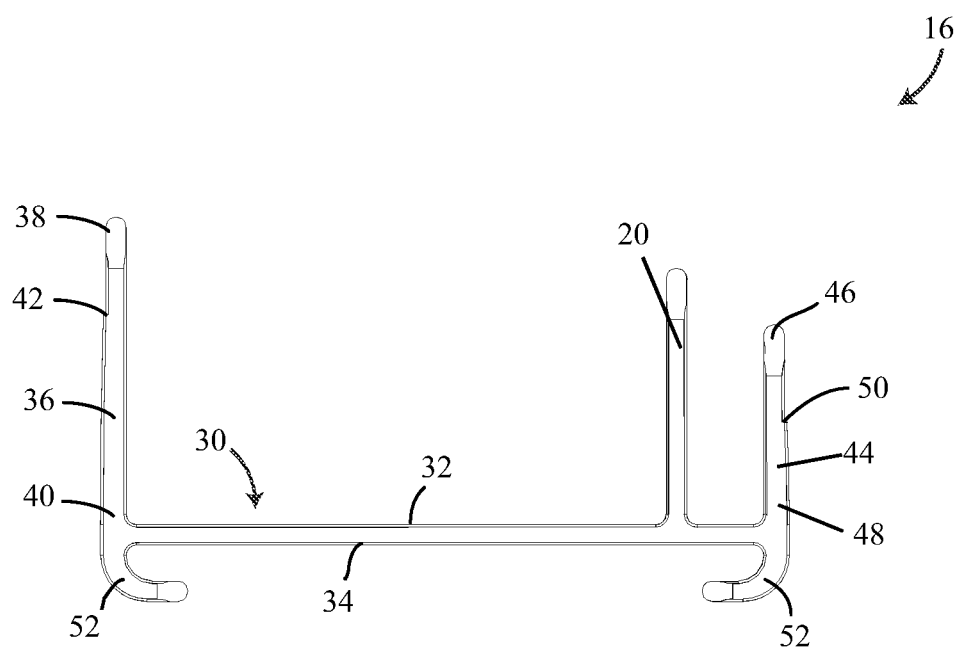
FIG. 8 is a front view of the exemplary vertical stand frame.
Figure 9:
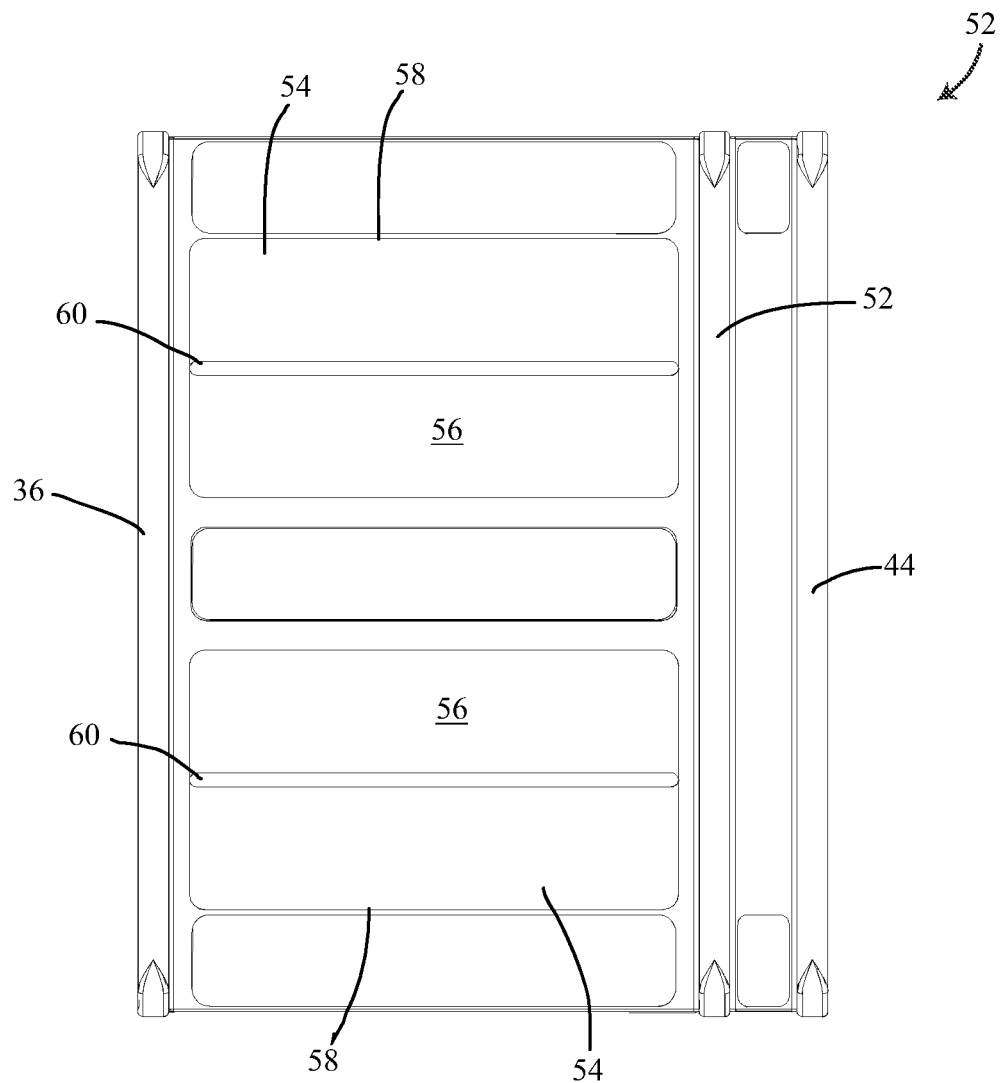
FIG. 9 is a top view of the exemplary vertical stand frame.
Figure 10:
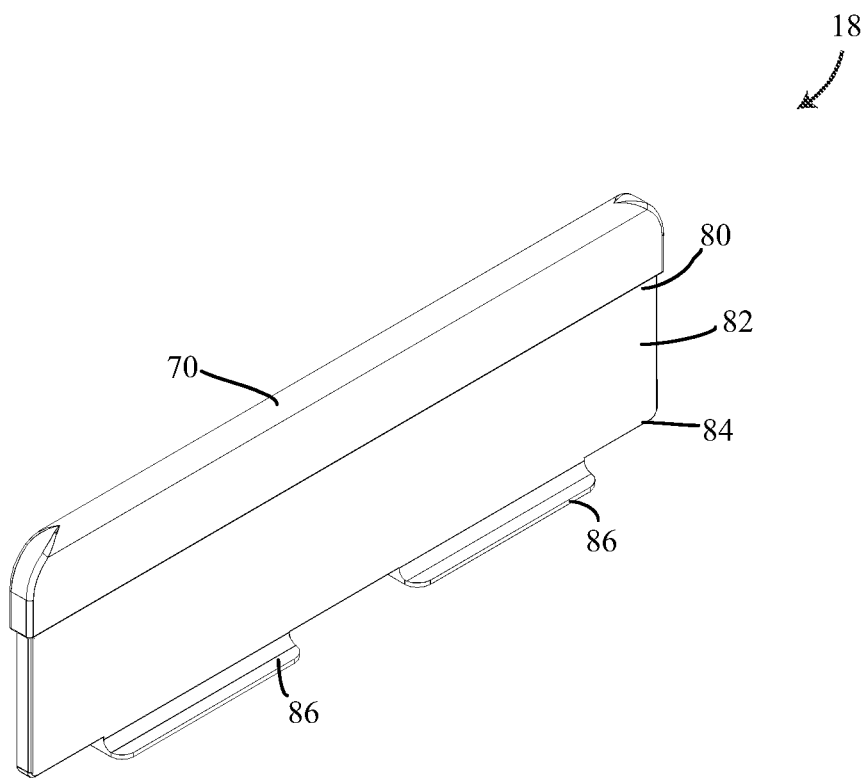
FIG. 10 is a perspective view of an exemplary divider.
Figure 11:
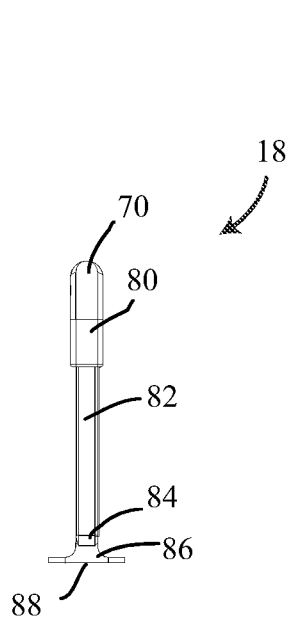
FIG. 11 is a front view of the exemplary divider.
Figure 12:
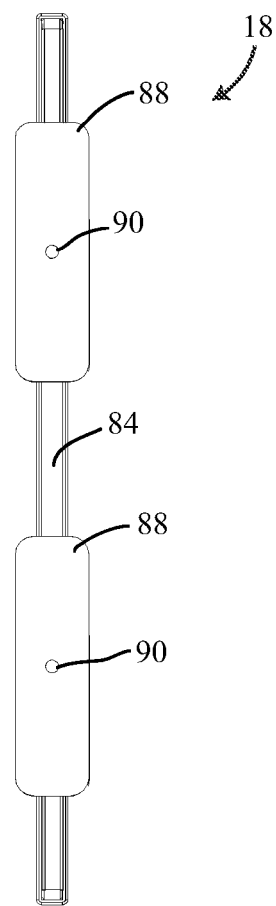
FIG. 12 is a bottom view of the exemplary divider.
Figure 13:
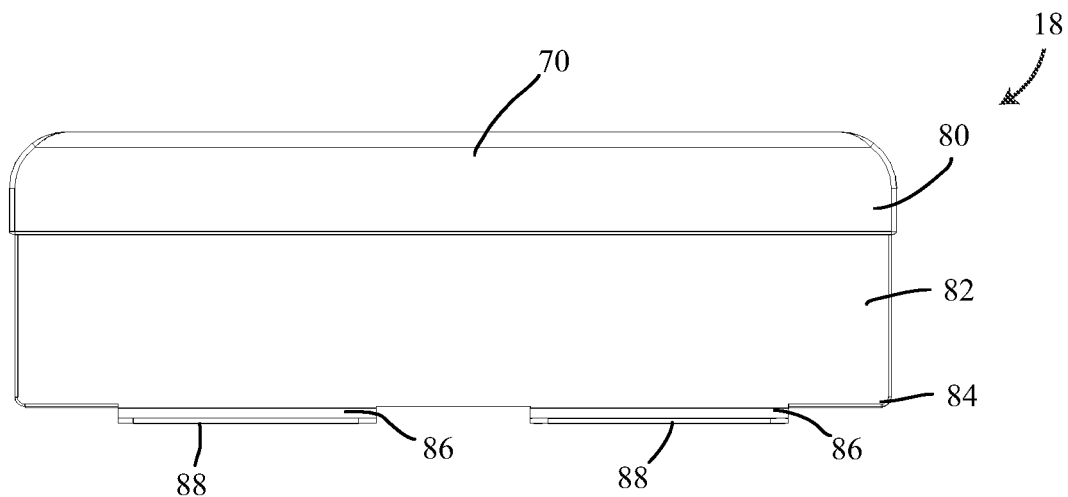
FIG. 13 is a side view of the exemplary divider.

Turning additionally to FIGS. 7-9, the frame 16 will be described in more detail. The frame 16 includes a frame base 30 having a top surface 32 and a bottom surface 34, a first side wall 36 forming the first side 12, a second side wall 44 forming the second side 14, and the fixed divider 20. The first and second side walls 36 and 44 project upward from the top surface 32 of the frame base 30 and each respectively include a top 38, 46, bottom 40, 48, and a shoulder 42, 50. The frame 16 also includes at least one foot 52 projecting downward from the bottom surface 34 of the frame base 30 at the first side 12 and at least one foot 52 projecting downward from the bottom surface 34 of the frame base 30 at the second side 14. Each foot 52 may extend along the length of the frame 16 or may be spaced along the length of the frame from another foot. For example, as shown, the frame 16 has three feet 52 at the first side 12 spaced along the length thereof from one another, and one foot 52 that extends the length of the stand at the second side 14. It should be appreciated that other embodiments may have a different foot configuration, including but not limited to, one extended foot on opposite sides of the frame base, one foot at each corner of the frame base, or a foot that extends the entire perimeter of the frame base.

To allow for movement of the moveable dividers 18, the top surface 32 of the frame base 30 has at least one recessed surface 54 extending down from the top surface 32 of the frame base 30 and defining at least one cavity 56. As shown, the frame base has a plurality of recessed surfaces 54. The at least one cavity 56 has a cavity edge 58 and may be substantially rectangular. To allow for attachment of the dividers 18 to the adjustment components 22, each cavity 56 has at least one slot 60 extending through the frame base 30. The at least one slot 60 may be perpendicular to the first and second side walls 36 and 44 may extend along the length of the cavities 56. The at least one slot 60 may extend through the frame base 30 from the at least one recessed surface to the bottom surface 34 of the frame base 30. Alternatively, the stand may have one or more slots without any cavities where the at least one slot 30 may extend through the frame base 30 from the top surface 32 of the frame base to the bottom surface 34 of the frame base. It will be appreciated that the stand may have any suitable number of cavities and slots.

Turning to FIGS. 10-14, the at least one movable divider 18 will be described in detail. The movable dividers 18 have a divider wall 82 having a divider top 80 and a divider base 84 configured to interface with the top surface 32 of the frame base 30 and receive the adjustment components 22. The movable dividers 18 also include at least one divider pedestal 86 extending downward from the divider base 84 that is configured to be disposed within the at least one cavity 56. As shown, the divider 18 has two divider pedestals 86 configured to be disposed in two separate cavities 56. Each divider pedestal 86 has a pedestal bottom surface 88 having a hole 90 extending into the divider wall 82 and configured to receive an adjustment component 22. Alternatively, the divider 18 may have a divider base bottom surface extending the length of the movable divider and having at least one hole extending into the divider wall and configured to receive an adjustment component.

To couple the movable dividers to the frame base 30, the movable dividers 18 are positioned between the first and second side walls 36 and 44 and the divider pedestals 86 are inserted into a respective one of the cavities 56. An attachment end 100 of the at least one adjustment component 22 is inserted through the at least one slot 60 in the frame base 30. Opposite the attachment end 100, the adjustment components 22 have a grip end 102 to allow toolless manipulation of the adjustment component 22. To couple with the divider, the grip end 102 is positioned below the bottom surface 34 of the frame base 30 when the attachment end 100 extends through the at least one slot 60 in the frame base 30 and into the hole 90 of a movable divider 18. As shown, the attachment end 100 is threaded to couple with the threaded hole 90 in the movable divider 18 and the grip end 102 is a ridged knob. Alternatively, the grip end may have a knurled knob or a polygonal knob with a plurality of gripping surfaces. In other embodiments, the at least one attachment component may be a setscrew, a bolt, a screw, a detent pin, or a cam-action clamp lever.

Figure 14:
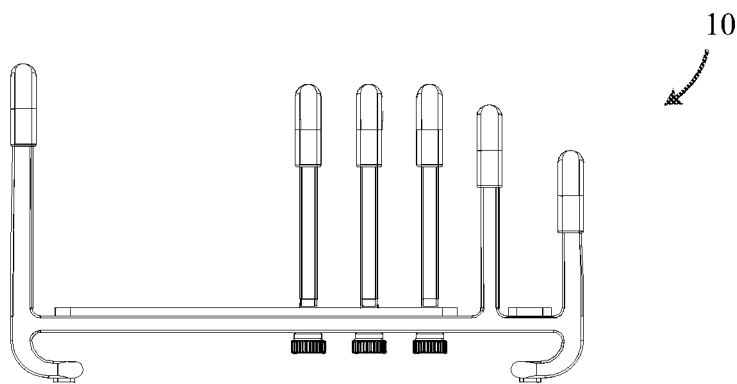
FIG. 14 is a top view of an exemplary stand with the dividers positioned distant from the stand first side wall.
Figure 15:
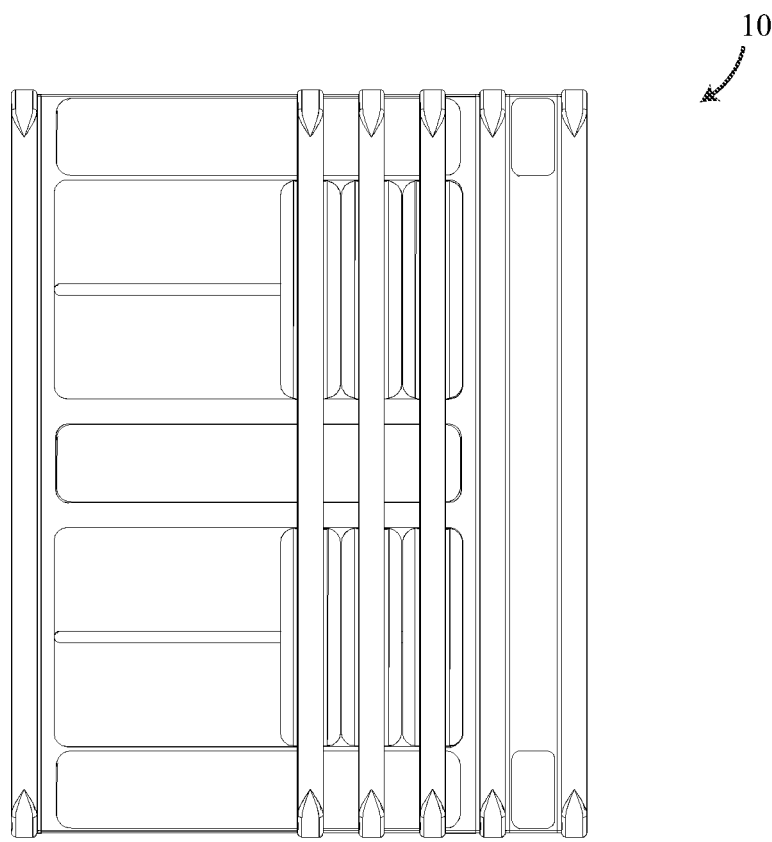
FIG. 15 is a front view of an exemplary stand with the dividers positioned distant from the stand first side wall.

Once coupled to the adjustment components, the movable dividers 18 are selectively positionable between the first side wall 36 and the second side wall 44. The at least one adjustment component 22 may have a first position to prevent movement of the movable divider and a second position to allow movement of the movable divider. In the first position, the at least one adjustment component 22 prevents movement of the movable divider 18 by compressing the frame base 30 between the at least one divider base pedestal bottom surface 88 and the grip end 100 of the at least one adjustment component 22. In the second position, the at least one adjustment component 22 is engaged with the divider but not fully secured to allow movement of the at least one divider. To position the at least one divider 18, a user would position the at least one adjustment component 22 in the second position and move or slide the divider 18 to the desired position between the first and second side walls 36 and 44. Once in the desired position, the user would move the at least one adjustment component 22 to the first position to set the position of the divider 18. FIGS. 14 and 15 illustrate the stand where the dividers 18 have been positioned as distant from the first side wall 36 allowed by the at least one slot 60, the at least one cavity 56, and the adjacent divider 18, while FIG. 1 shows the dividers 18 spaced from one another.

As described, the at least one adjustment component 22 can be moved between the first and second positions by hand without a tool. In the first position, the threaded knob is hand tightened to compress the frame base and prevent movement of the divider. In the second position, the threaded knob is sufficiently loose to allow the divider to move along the length of the slots in the respective cavity. Alternative embodiments can allow toolless adjustability depending on the type of adjustment component, while other embodiments may use a tool like a hex wrench or a screwdriver to change the at least one adjustment component 22 between the two positions to adjust the position of the at least one divider 18.

When the stand 10 is fully assembled, as shown in FIGS. 1, 2 and 4-6, and the at least one divider 18 is disposed between the first side wall 36 and the second side wall 44, the divider wall 82 is parallel to the first side wall 36 and second side wall 44. The hole 90 in each pedestal bottom surface 88 aligns with the at least one slot in the divider base 30. Additionally, the pedestal bottom surface 88 and the recessed surface 54 of the frame base 30 contact each other such that the at least one divider pedestal 88 is placed into the at least one cavity 56 in the frame base 30. When the movable divider's at least one pedestal 86 is disposed within the at least one cavity 56, the interface between the divider pedestal 86 and the cavity edge 58 prevents rotation of the divider 18.

The stand may include a plurality of bumpers 70 to act as a cushion between an electronic and the frame 16 and movable dividers 18 when the electronic is placed in a receiving space 24 or the fixed receiving space 26. The bumpers 70 may be positioned on the tops 38, 46 of the first and second side walls 36, 44, the divider tops 80, and a top of the fixed divider 20. The shoulders 42, 50 of the first and second wall 36, 44 may be configured to abut a bottom surface of one of the plurality of bumpers 70. It will be appreciated that the dividers and the fixed divider may also have shoulders configured to abut a bottom surface of the plurality of bumpers. The plurality of bumpers 70 may be made of a non-marring material, like a rubber or silicone based material.

The stand may further include support pads 72 that act as a cushion between the frame base 30 and an electronic device when the electronic device is placed in one of the receiving spaces 24 or the fixed receiving space 26. The stand may have at least one support pad 72 disposed on the top surface 32 of the frame base 30, and as shown three spaced pads 72, one placed on each side of the cavities 56. The stand may also include foot pads 74 that act as a cushion between the stand 10 and a desk or other substrate the stand is placed on. The foot pads may be disposed on the bottom of the frame feet 52. It will be appreciated that the number of foot pads 74 may correspond to the number of frame feet 52. The at least one support pad 72 and foot pads 74 may be made of a non-marring material, like a rubber or silicone based material.

In an alternative embodiment without cavities, when the stand is fully assembled and the at least one divider is disposed between the first side wall and the second side wall, the divider wall may be parallel to the first side wall and second side wall. The hole in each divider base bottom surface may align with the at least one slot in the divider base. Additionally, the divider base bottom surface and the top surface of the frame base may contact each other. In this embodiment, the coupling of the movable divider and the at least one attachment component prevents rotation of the divider through the interaction of the at least one slot in the frame and the attachment end of the at least one adjustment component extending through the said slots.

The aforementioned systems, components, (e.g., frames, dividers, among others), and the like have been described with respect to interaction between several components and/or elements. It should be appreciated that such devices and elements can include those elements or sub-elements specified therein, some of the specified elements or sub-elements, and/or additional elements. Further yet, one or more elements and/or sub-elements may be combined into a single component to provide aggregate functionality. The elements may also interact with one or more other elements not specifically described herein.

While the embodiments discussed herein have been related to the apparatus, systems and methods discussed above, these embodiments are intended to be exemplary and are not intended to limit the applicability of these embodiments to only those discussions set forth herein.

The above examples are merely illustrative of several possible embodiments of various aspects of the present invention, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (e.g., that is functionally equivalent), even though not structurally equivalent to the disclosed structure which performs the function in the illustrated implementations of the invention. In addition although a particular feature of the invention may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising."

This written description uses examples to disclose the invention, including the best mode, and also to enable one of ordinary skill in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that are not different from the literal language of the claims, or if they include equivalent structural elements with insubstantial differences from the literal language of the claims.

In the specification and claims, reference will be made to a number of terms that have the following meanings. The singular forms "a", "an" and "the" include plural referents unless the context clearly dictates otherwise. Approximating language, as used herein throughout the specification and claims, may be applied to modify a quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Moreover, unless specifically stated otherwise, a use of the terms "first," "second," etc., do not denote an order or importance, but rather the terms "first," "second," etc., are used to distinguish one element from another.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be."

The best mode for carrying out the invention has been described for purposes of illustrating the best mode known to the applicant at the time and enable one of ordinary skill in the art to practice the invention, including making and using devices or systems and performing incorporated methods. The examples are illustrative only and not meant to limit the invention, as measured by the scope and merit of the claims. The invention has been described with reference to preferred and alternate embodiments. Obviously, modifications and alterations will occur to others upon the reading and understanding of the specification. It is intended to include all such modifications and alterations insofar as they come within the scope of the appended claims or the equivalents thereof. The patentable scope of the invention is defined by the claims, and may include other examples that occur to one of ordinary skill in the art. Such other examples are intended to be within the scope of the claims if they have structural elements that do not differentiate from the literal language of the claims, or if they include equivalent structural elements with insubstantial differences from the literal language of the claims.

What is claimed is:

1. A stand for holding electronic devices, comprising:
a frame including a frame base, and first and second side walls extending from the frame base, the frame base having a top surface, a bottom surface, and at least one slot perpendicular to the first and second side wall, the at least one slot extending through the frame base;
at least one adjustment component configured to extend through the at least one slot in the frame base; and
at least one divider configured to be disposed between the first side wall and the second side wall and including a divider wall having a divider top and divider base having a bottom surface with at least one hole extending into the divider wall from the bottom surface of the divider base, the at least one hole configured to receive the at least one adjustment component,
wherein when the at least one divider is disposed between the first side wall and the second side wall, the divider wall of the at least one divider is parallel to the first and second side walls, the bottom surface of the divider base of the at least one divider contacts the top surface of the frame base, the at least one hole of the at least one divider is aligned with the at least one slot, and the at least one divider is selectively positionable between the first and second side walls.

2. The stand according to claim 1, further comprising a fixed divider wall integrally formed with the base, the fixed divider wall projecting up from the top surface of the frame base between and parallel to the first and second side walls and proximate the second side wall, the fixed divider wall defining a receiving space between the second side wall and the fixed divider wall.

3. The stand according to claim 1, wherein the at least one adjustment component is any one of a threaded knob, a set screw, a bolt, a screw, a detent pin, and a cam-action clamp.

4. The stand according to claim 1, wherein the at least one adjustment component comprises a first end disposed below the frame base and a second end opposite the first end extending through the slot and above the top surface of the frame base, wherein the at least one adjustment component has a first position that prevents movement of the at least one divider and a second position where the at least one divider is movable to one of a plurality of positions between the first and second side walls.

5. The stand according to claim 1, further comprising at least one foot integrally formed with the frame, the at least one foot projecting downward from the bottom surface of the frame base below the first side wall and at least one foot projecting downward from the bottom surface of the frame base below the second side wall.

6. The stand according to claim 5, wherein the at least one foot projecting downward below the first side wall includes a plurality of feet spaced along a length of the first side wall.

7. The stand according to claim 6, wherein each foot has one or more foot pads on a bottom surface thereof.

8. The stand according to claim 1, further comprising at least one support pad disposed on the top surface of the frame base between the first and second side walls of the frame such that electronic devices placed between the first and second side walls rest on the at least one support pad.

9. The stand according to claim 1, further comprising a plurality of bumpers, wherein one of the plurality of bumpers is disposed on a top of the first side wall, a top of the second side wall, and a top of the at least one divider.

10. The stand according to claim 9, wherein the first side wall and the second side wall each include a shoulder configured to contact and support a bottom surface of the plurality of bumpers.

11. The stand according to claim 1, wherein the frame additionally includes at least one recessed surface projecting down from the top surface defining at least one cavity.

12. The stand according to claim 11, wherein the at least one divider includes a pedestal configured to be received in the cavity.

13. A stand for holding electronic devices, comprising:
a frame including a frame base, and first and second side walls extending from the frame base, the frame base having a top surface, a bottom surface, and at least one recessed surface projecting down from the top surface defining at least one cavity; and at least one divider configured to be disposed between the first side wall and the second side wall and including a divider wall having a divider top and a divider base having at least one flanged pedestal, the at least one flanged pedestal having a bottom surface, wherein when the at least one divider is disposed between the first side wall and the second side wall, the divider wall is parallel to the first and second side walls, the at least one flanged pedestal is received in the at least one cavity such that the bottom surface of the at least one flanged pedestal contacts the recessed surface of the frame base, and the at least one divider is selectively positionable between the first and second side walls.

14. The stand according to claim 13, wherein the frame further comprises at least one slot perpendicular to the first and second side walls in the at least one cavity, the at least one slot extending through the frame base, and wherein the bottom surface of the at least one flanged pedestal has a hole configured to receive an adjustment component.

15. The stand according to claim 14, further comprising at least one adjustment component configured to extend through the at least one slot in the frame base.

16. The stand according to claim 15, wherein the at least one adjustment component further comprises a first end disposed below the frame base and a second end opposite the first end extending through the slot, above the recessed surface of the frame base and into the hole of the at least one flanged pedestal, wherein the first end of the at least one adjustment component has a first position that prevents movement of the at least one divider and a second position where the at least one divider is movable to one of a plurality of positions between the first and second side walls.

17. The stand according to claim 13, further comprising at least one foot integrally formed with the frame, the at least one foot projecting downward from the bottom surface of the frame base below the first side wall and at least one foot projecting downward from the bottom surface of the frame base below the second side wall.

18. The stand according to claim 17, wherein the at least one foot projecting downward below the first side wall includes a plurality of feet spaced along a length of the first side wall.

19. The stand according to claim 13, further comprising a plurality of bumpers, wherein one of the plurality of bumpers is disposed on a top of the first side wall, a top of the second side wall, and a top of the at least one divider.

20. A stand for holding electronic devices, comprising;
a frame including a frame base, and first and second side walls extending from the frame base, the frame base having a top surface, a bottom surface, and at least one slot perpendicular to the first and second side wall, the at least one slot extending through the frame base;
at least one foot projecting downward from the bottom surface of the frame base below the first side wall and at least one foot projecting downward from the bottom surface of the frame base below the second side wall;
at least one adjustment component having a grip end configured to be disposed below the bottom surface of the frame base and an attachment end opposite the grip end configured to extend through the at least one slot of the frame base; and
at least one divider configured to be disposed between the first side wall and the second side wall and including a divider wall having a divider top and divider base having a bottom surface with at least one hole extending into the divider wall from the bottom surface of the divider base, the at least one hole configured to receive the at least one adjustment component,
wherein when the at least one divider is disposed between the first side wall and the second side wall, the wall of the at least one divider is parallel to the first and second side walls, the bottom surface of the divider base of the at least one divider contacts the top surface of the frame base, the at least one hole of the at least one divider is aligned with the at least one slot, and the at least one divider is selectively positionable between the first and second side walls, and
wherein the adjustment component has a first position that prevents movement of the at least one divider and a second position where the at least one divider is movable to one of a plurality of positions between the first and second side walls.

* * * * *